United States Patent [19]

Kramer

[11] Patent Number: 4,689,873
[45] Date of Patent: Sep. 1, 1987

[54] IMAGING DEVICE HAVING TWO ANTI-REFLECTION LAYERS ON A SURFACE OF SILICON WAFER

[75] Inventor: William M. Kramer, Lancaster, Pa.
[73] Assignee: RCA Corporation, Princeton, N.J.
[21] Appl. No.: 769,742
[22] Filed: Aug. 27, 1985

Related U.S. Application Data

[62] Division of Ser. No. 489,303, Apr. 28, 1983, Pat. No. 4,594,605.

[51] Int. Cl.[4] ............ H01L 27/14; H01L 31/18
[52] U.S. Cl. .................. 437/2; 427/126.1; 148/DIG. 172
[58] Field of Search ............ 29/572; 357/31; 350/166; 313/367; 427/89, 90, 126.1; 148/172

[56] References Cited

U.S. PATENT DOCUMENTS

| 2,601,806 | 7/1952 | Turner | 350/165 |
| 3,076,861 | 2/1963 | Samulon et al. | 136/89 |
| 3,403,284 | 9/1968 | Buck et al. | 148/DIG. 172 |
| 4,055,442 | 10/1977 | Crosher | 136/89 |
| 4,228,446 | 10/1980 | Kramer | 357/31 |
| 4,232,245 | 11/1980 | Savoye et al. | 313/367 |
| 4,260,222 | 4/1981 | Kozawa | 350/164 |
| 4,547,957 | 10/1985 | Savoye et al. | 29/572 |

FOREIGN PATENT DOCUMENTS

1526171 9/1978 United Kingdom .

386363 9/1973 U.S.S.R. .............. 350/164

OTHER PUBLICATIONS

"Multilayer Anti-reflection Coatings For Optical Components", by D. J. Pacey, pp. 270–283, Manufacturing Optics International, vol. 22, No. 5 (Nov. 1969).
"The Monitoring Of Thin Films For Optical Purposes", by H. A. Macleod, pp. 383–390, Vacuum, vol. 27/No. 4.

Primary Examiner—Olik Chaudhuri
Attorney, Agent, or Firm—Eugene M. Whitacre; Dennis H. Irlbeck; Vincent J. Coughlin, Jr.

[57] ABSTRACT

An imaging device such as a silicon vidicon has a wafer of single crystal semiconductor material having an input sensing region and a charge storage region. A potential barrier is included within the input sensing region for controlling blooming. A passivation region is also included within the input sensing region to stabilize the atomic energy level along a first surface of the wafer. An anti-reflection layer of zinc sulfide and an anti-reflection layer of magnesium fluoride or Cryolite are sequentially deposited on the first surface of the wafer. The two anti-reflection layers form an anti-reflection region which enhances the quantum efficiency of the device in the wavelength range of 400 to 500 nanometers. Each of the layers has an optical thickness substantially equal to a quarter of the wavelength of light incident on the device. A method of forming the anti-reflection region is also disclosed.

2 Claims, 6 Drawing Figures

IMAGING DEVICE HAVING TWO ANTI-REFLECTION LAYERS ON A SURFACE OF SILICON WAFER

This is a division of application Ser. No. 489,303, filed Apr. 28, 1983, now U.S. Pat. No. 4,594,605.

BACKGROUND OF THE INVENTION

This invention relates to imaging devices utilizing single crystal semiconductor wafers and more particularly to a silicon vidicon having an improved anti-reflection region for increasing the quantum efficiency of the device in the wavelength range of 400 to 500 nanometers and a method of making the anti-reflection region.

Imaging devices such as silicon vidicons and silicon intensifier tubes employ sensing elements or targets comprising single crystal semiconductor wafers. The operation of such targets in these devices is well known in the art and is described, for example, in U.S. Pat. No. 4,232,245 issued to Savoye et al., on Nov. 4, 1980 and incorporated by reference herein for the purpose of disclosure. Such devices are frequently used in surveillance cameras for monitoring unattended areas. As described in the aforementioned patent, a passivating layer of borosilicate glass is deposited on the input sensing surface of the target. An anti-reflection layer is then deposited on the passivating layer. U.S. Pat. No. 4,228,446 issued to W. M. Kramer on Oct. 14, 1980 and incorporated by reference herein for the purpose of disclosure, describes a device having an anti-reflection layer for a silicon target wherein the anti-reflection layer in combination with the passivating layer forms an anti-reflection region having an optical thickness substantially equal to an odd multiple of a quarter of the wavelength of light incident upon the device. The anti-reflection region described in U.S. Pat. No. 4,228,446 increases the spectral response of the device over a wavelength range from about 400 to 1000 nanometers and enhances the quantum efficiency in the wavelength range of about 550 to 600 nanometers. However, the quantum efficiency of such a device over the wavelength range of 400 to 500 nanometers decreases rapidly as the wavelength of incident light decreases.

Many illumination sources which are used in conjunction with surveillance cameras have spectral distributions with intensity peaks occuring below the quantum efficiency peak of 550 to 600 nanometers described in U.S. Pat. No. 4,228,446, referenced above. For example, a mercury arc lamp has an intensity peak at about 455 nanometers and a fluorescent daylight lamp has an intensity peak at about 450 nanometers. It is, therefore, desirable to increase the quantum efficiency of the imaging device within the wavelength range of 400 to 500 nanometers without substantially decreasing the quantum efficiency within the range of 550 to 600 nanometers.

SUMMARY OF THE INVENTION

An imaging device includes a wafer of single crystal semiconductor material having a first surface with an input sensing region and a second surface with a charge storage region. A potential barrier for controlling blooming is formed in the sensing region and a passivation region within the sensing region stabilizes the atomic energy level along the first surface. The device is improved by forming a novel anti-reflection region on the passivation region for reducing reflection and increasing absorption of light incident upon the device. The anti-reflection region comprises two contiguous layers. The first layer which is located closer to the wafer than the second layer is formed of a material having a high index of refraction ranging from 2.3 to 2.4, which is less than that of the wafer. The second layer is formed of a material having an index of refraction lower than said first layer. The first and second layers each have an optical thickness substantially equal to a quarter of the wavelength of light incident upon the device.

DETAILED DESCRIPTION OF THE PREFERRED EMBODIMENT

Figure 1:
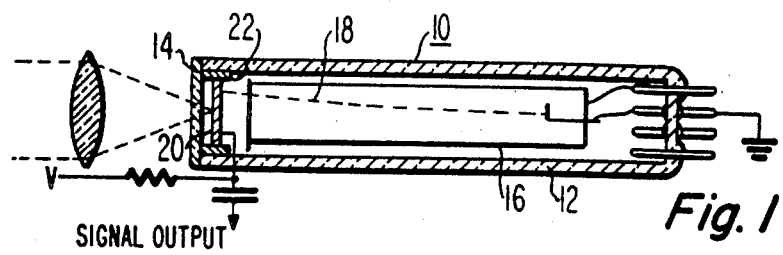
FIG. 1 is a longitudinal sectional view of an improved vidicon camera tube utilizing the present invention.

A preferred embodiment of a novel imaging device is a vidicon camera tube 10, as shown in FIG. 1, having an evacuated envelope 12 with a transparent faceplate 14 at one end of the envelope 12 and including an electron gun assembly 16 inside the envelope 12 for forming a low velocity electron beam 18. A target 20 comprising a wafer of single crystal semiconductor material is mounted on a support spacer 22 and is positioned adjacent the inside surface of the faceplate 14 in a manner suitable for receiving a light input image. Means (not shown) for magnetically focusing the beam 18 toward the target 20 and for causing the beam 18 to scan the surface of the target 20 may be disposed outside the envelope 12.

Figure 2:
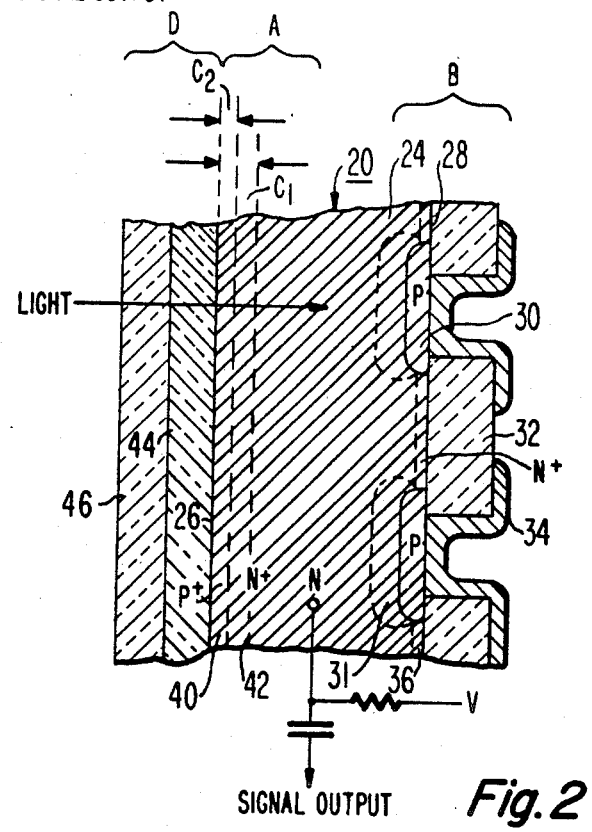
FIG. 2 is an enlarged fragmentary sectional view of a silicon target suitable for use in the tube of FIG. 1.

The target 20, a fragment of which is shown in FIG. 2, is a wafer-shaped silicon photodiode target having an N-type conductivity bulk region 24 of a single crystal of elemental silicon with first and second opposed major surfaces 26 and 28, respectively. The first major surface 26, also known as the well-side surface, comprises the input sensing surface of the target 20 for receiving the input light image. The second major surface 28 faces the electron gun assembly 16, when mounted in the tube of FIG. 1, and is commonly referred to as the scan surface or diode side portion of the target 20. The target 20 includes a charge storage region "B" along a section including the scan surface 28, and an input sensing region "A" along a section including the input sensing surface 26. The charge storage region "B" includes on the scan surface 28 of the silicon wafer 24, an array of discrete "PN" junction storage diodes 30. A depletion region 31 associated with each of the diodes 30 extends into the bulk 24. The extent of the depletion region 31 depends on the reverse bias condition of the diode. An insulating layer 32 of silicon dioxide is provided on the scan surface 28 between the discrete diodes 30 to shield the bulk region 24 from the effect of the scanning electron beam 18. Contact pads 34 of P-type silicon are provided which cover the P-type surfaces of the discrete diodes 30 and overlap the insulating layer 32 of silicon dioxide about the periphery of the diodes 30 in a manner well known in the art. Such pads improve the contact of the scanning beam 18 with the diodes 30. An N+ region 36, which extends into the wafer 24 from the second major surface 28, is provided to eliminate electrical leakage from the silicon-silicon dioxide interface.

Figure 3:
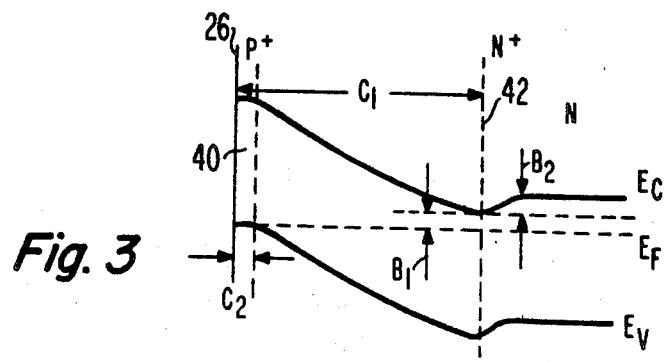
FIG. 3 is a band diagram showing the energy level configuration in the region of the input sensing portion of the target shown in FIG. 2.

Along the input sensing region "A", extending from the input sensing surface 26 into the bulk 24 of the silicon target 20, there is provided an energy level configuration of the wafer 24 such as that shown in FIG. 3. A shallow P+ passivation region 40 is provided along the input sensing surface 26 to a depth $C_2$ to effectively fix the valance band $E_v$ in that region of the target 20 substantially at the Fermi level, $E_f$, and an N+ potential barrier 42 is provided a distance $C_1$ from the input sensing surface 26 for accomplishing blooming control. $C_1$ represents the distance from the surface 26 to the peak or maximum of the N+ distribution. The N+ potential barrier 42 is preferably located such that $C_1$ is about 600 Å. The distribution of the doping profile in the region of the N+ potential barrier 42 relative to the N-type bulk 24 of the silicon target 20, should have the characteristic ($B_1$ and $B_2$) necessary for achieving the blooming reduction mechanism described in "Theory, Design, and Performance of Low-Blooming Silicon Diode Array Imaging Targets" by B. M. Singer et al, in *IEEE Transaction on Electron Devices*, volume ED-21, pages 84–89, January 1974, herein incorporated by reference. The fabrication of silicon target 20 having regions "A" and "B" is described in U.S. Pat. No. 4,547,957 which is a continuation-in-part of Ser. No. 387,365 filed on June 11, 1982 by Savoye et al., now abandoned, assigned to the assignee of the present invention, and incorporated herein for the purpose of disclosure.

In the present novel structure, it has been found that the quantum efficiency of the device is improved by providing two contiguous anti-reflection layers, 44 and 46, which combine to form an anti-reflection region "D" on the passivation region 40 of the target 20. The first layer 44 of suitable index of refraction is deposited on the first major surface 26 of the target 20. The second layer 46 of suitable index of refraction is deposited on the first layer 44. Each of the anti-reflection layers 44 and 46 has an optical thickness substantially equal to a quarter of the wavelength of light incident upon the device. The layers 44 and 46 reduce reflection of incident light and increase the absorption of light to increase the sensitivity and quantum efficiency of the device. Where the semiconductor wafer is silicon having an index of refraction of about 3.5, it has been determined that the first anti-reflection layer 44 should have an index of refraction, $n_1$, in the range of 2.3 to 2.4 and the second anti-reflection layer 46 should have an index of refraction, $n_2$, in the range of 1.32 to 1.35.

Zinc sulfide, which is noninteractive with silicon, and has an index of refraction in the desired range of 2.3 to 2.4 is preferred as the material for the first layer 44. Magnesium flouride or sodium-aluminum fluoride, known as "cryolite", which have indices of refraction in the desired range, of 1.32 to 1.35 are useful materials for the second layer 46. Both magnesium fluoride and cryolite can be deposited on the first layer 44 by a resistive deposition method that is preferred over electron beam evaporation which is required for some other materials of low refractive index. The electron gun, used for electron beam evaporation, creates X-rays and ions which bombard the silicon target and detrimentally disturb the lattice structure.

Figure 4:
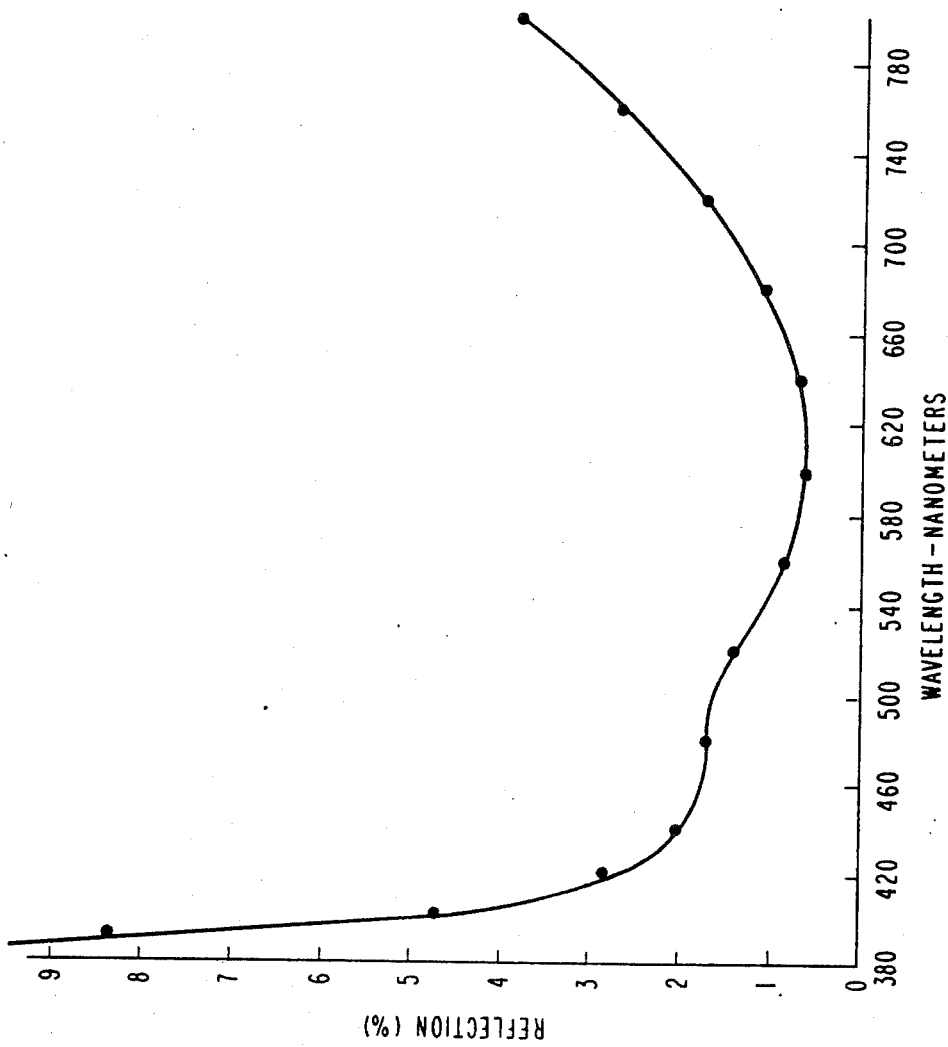
FIG. 4 shows the curve illustrating the optical characteristics of the two-layer anti-reflection region according to the present invention.

In the manufacture of the target 20, the antireflection region "D" may be formed by first inserting the target in a conventional evaporator (not shown) capable of attaining a vacuum of at least $1 \times 10^5$ torr. It is preferable to use an oilless system to prevent contamination of the target. The evaporator is adapted to sequentially evaporate zinc sulfide and then magnesium fluoride from separate sources onto the first major surface 26 of the target 20. The zinc sulfide is deposited onto the surface 26 at a deposition rate of about 300 Angstroms (Å) per minute as monitored and/or controlled by any well known device such as a Sloan Thickness Monitor. The zinc sulfide is deposited to a metric thickness, $h_1$, of about 450 Å to form the first anti-reflection layer 44. The magnesium fluoride is then deposited onto the previously deposited layer of zinc sulfide at a deposition rate of about 300 Å per minute to a metric thickness, $h_2$, of about 850 Å to form the second anti-reflection layer 46. The target 20 is at ambient temperature during the deposition of layers 44 and 46. The above-indicated metric thicknesses for each of the anti-reflection layers 44 and 46 provide an optical thickness equal to a quarter of the wavelength of light incident on the target 20 of the device ($\lambda/4 = n \cdot h$). Subsequent to the formation of layers 44 and 46, the device temperature is limited to preferably about 125° C. to prevent an increase in the refractive index of the layer 46 which would increase the reflection of the layer 46 and decrease the quantum efficiency of the device. FIG. 4 shows a curve of the optical characteristics of the above-described two-layer anti-reflection region. The reflectivity of the anti-reflection region "D" formed by contiguous layers 44 and 46 is less than 4.75% in the range of 400 to 800 nanometers and less than 1.8% in the range of 450 to 700 nanometers.

Figure 5:
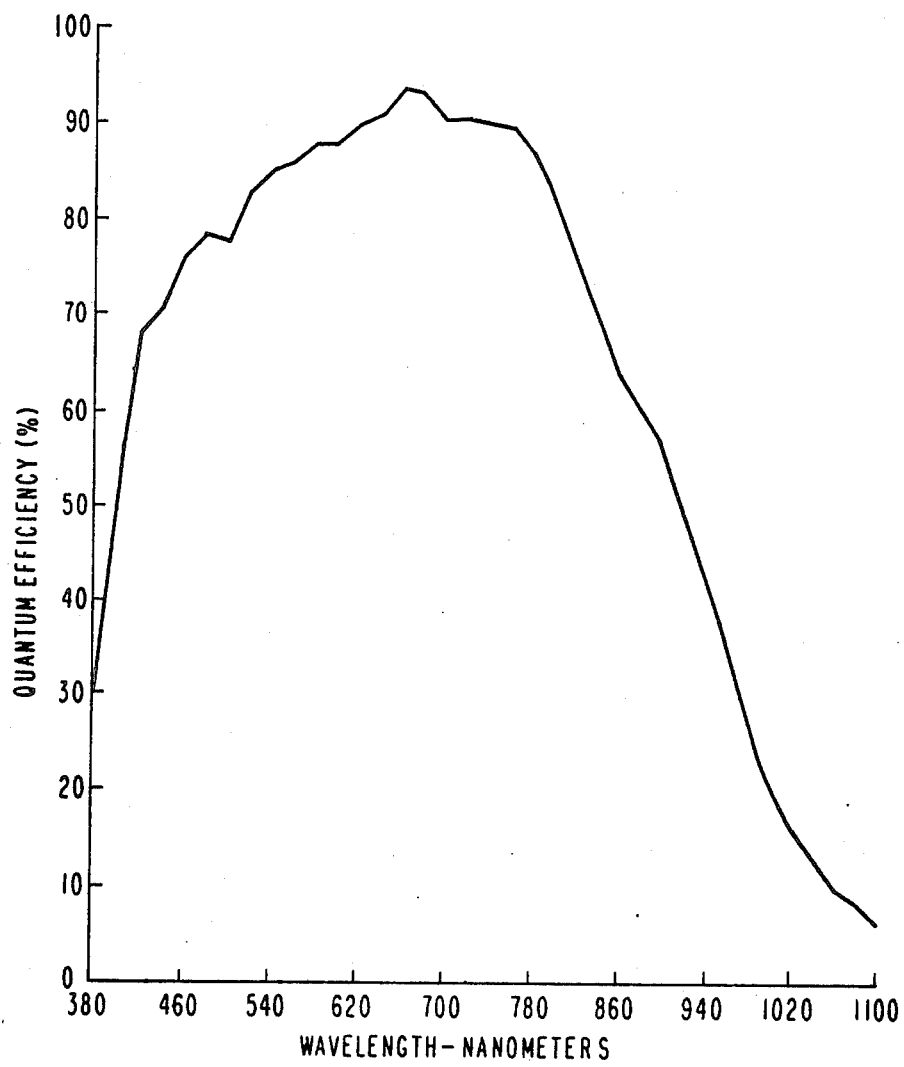
FIG. 5 shows the quantum efficiency of a prior art target.
Figure 6:
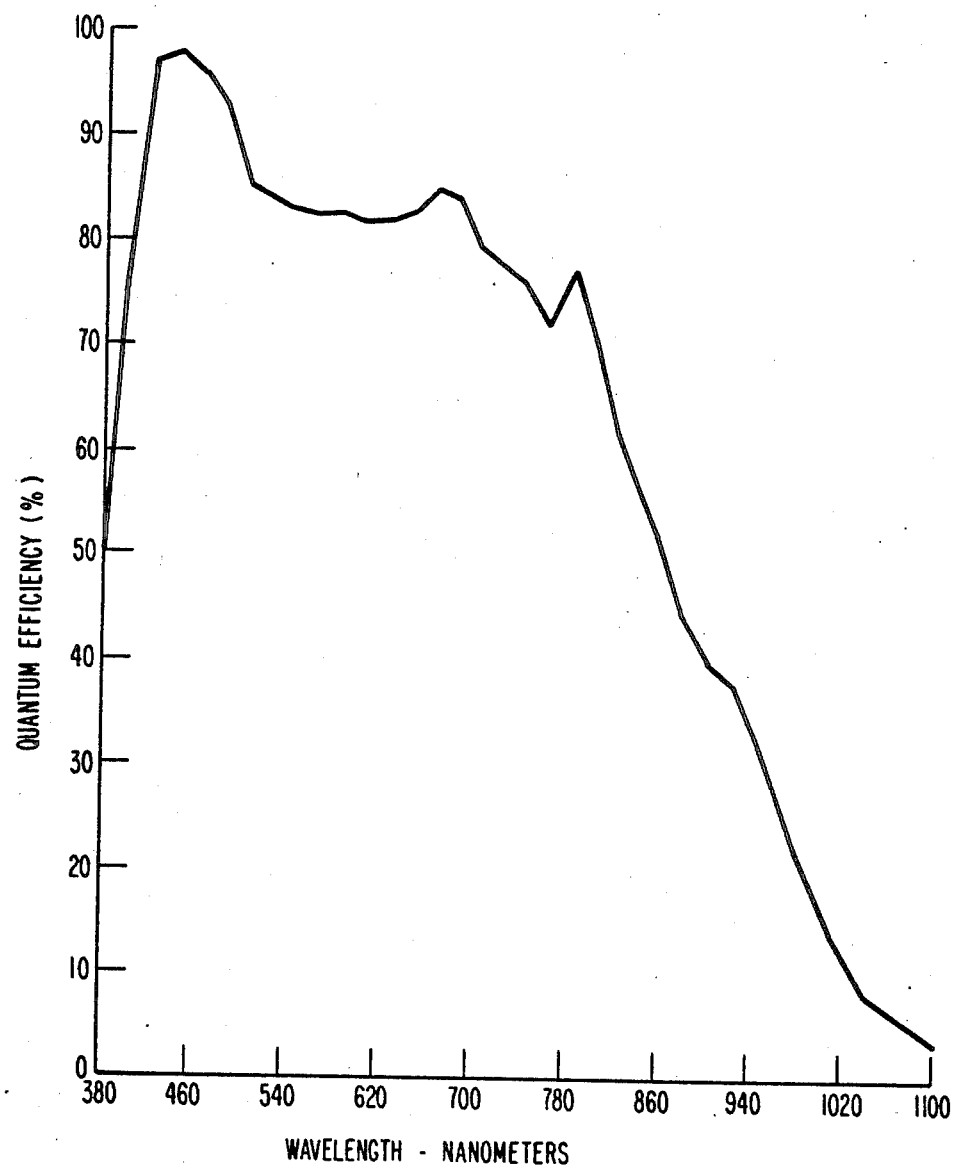
FIG. 6 shows the quantum efficiency of the present target utilizing the two-layer anti-reflection region.

The quantum efficiency of a conventional silicon target having an anti-reflection region fabricated by the method described in U.S. Pat. No. 4,228,446, referenced above, is shown in FIG. 5. The peak quantum efficiency of about 93% occurs at about 660 nanometers. The quantum efficiency at 400 nanometers is about 50% and increases to only about 78% at 500 nanometers. A silicon target 20 made according to the present novel method and having a two-layer anti-reflection region comprising contiguous layers of zinc sulfide and magnesium fluoride or cryolite has a quantum efficiency of about 77% at 400 nanometers with a quantum efficiency of about 86% at 500 nanometers. The peak quantum efficiency of about 98% in the novel target 20 occurs at about 440 nanometers making the novel silicon target 20 more sensitive than the conventional target within the wavelength range of 400–500 nanometers. It can be seen that although the peak quantum efficiency for the novel device is in the wavelength range of 400–500 nanometers, the quantum efficiency is enhanced over a range from about 380 nanometers to about 560 nanometers.

Although described in the preferred embodiment of a silicon vidicon target, the anti-reflection region for enhancing quantum efficiency is also applicable to solid state charge storage imaging devices such as CCD's and CID's.

What is claimed is:

1. A method of making an imaging device having improved quantum efficiency in the range of 400 nanometers to 500 nanometers comprising the steps of:

preparing a silicon wafer of a first-type conductivity, said wafer having first and second major surfaces;

forming a plurality of regions of a second-type conductivity in the second major surface of said wafer;

implanting an element into said first major surface of said wafer so as to form a region of enhanced first-type conductivity for controlling blooming spaced from said first surface;

forming a shallow region of second-type conductivity extending into said wafer from said first surface a distance less than said region of enhanced first-type conductivity, providing a first anti-reflection layer on said first surface of said wafer by depositing thereon at ambient temperature a material having a high index of refraction ranging from 2.3 to 2.4 thereon, said first anti-reflection layer having an optical thickness substantially equal to a quarter of the wavelength of light incident thereon;

providing a second anti-reflection layer on said first anti-reflection layer by depositing thereon at ambient temperature a material having a low index of refraction ranging from 1.32 to 1.35 thereon, said second anti-reflection layer having an optical thickness substantially equal to a quarter of the wavelength of light incident thereon; and limiting the processing temperature of said device to about 125° C. to prevent an increase in the index of refraction of said second anti-reflection layer.

2. A method of making an imaging device having improved quantum efficiency in the range of 400 nanometers to 500 nanometers, comprising the steps of:

preparing a silicon wafer of a first-type conductivity, said wafer having first and second major surfaces;

forming a plurality of regions of a second-type conductivity in the second major surface of said wafer;

implanting an element into the first major surface of said wafer so as to form a region of enhanced first-type conductivity, spaced from the first surface, for controlling blooming;

forming a shallow region of second-type conductivity extending into said wafer from the first surface a distance less than said region of enhanced first-type conductivity;

providing a first anti-reflection layer on the first surface of said wafer by depositing thereon, at ambient temperature, zinc sulfide having an index of refraction ranging from about 2.3 to 2.4, said first anti-reflection layer having a metric thickness of about 450 Å and an optical thickness substantially equal to a quarter of the wavelength of light incident thereon;

providing a second anti-reflection layer on said first anti-reflection layer by depositing thereon, at ambient temperature, a material selected from the group consisting of magnesium fluoride and cryolite and having an index of refraction ranging from about 1.32 to 1.35, said second anti-reflection layer having a metric thickness of about 850 Å and an optical thickness substantially equal to a quarter of the wavelength of light incident thereon; and limiting the temperature of the device to about 125° C. to prevent an increase in the index of refraction of said second anti-reflection layer.

* * * * *